(12) United States Patent  
Abele

(10) Patent No.: US 7,116,198 B1
(45) Date of Patent: Oct. 3, 2006

(54) MRI CONICAL MAGNET IMAGING SYSTEM

(75) Inventor: Manlio Abele, New York, NY (US)

(73) Assignee: BRK Wireless Company, Inc., Park Ridge, IL (US)

( * ) Notice: Subject to any disclaimer, the term of this patent is extended or adjusted under 35 U.S.C. 154(b) by 231 days.

(21) Appl. No.: 10/936,957

(22) Filed: Sep. 10, 2004

(51) Int. Cl.
*H01F 1/00* (2006.01)
(52) U.S. Cl. .................................. 335/296; 335/302
(58) Field of Classification Search ........ 335/296–299, 335/302–306
See application file for complete search history.

(56) References Cited

U.S. PATENT DOCUMENTS 5,436,607 A * 7/1995 Chari et al. ................. 335/216
6,157,278 A * 12/2000 Katznelson et al. ........ 335/296
6,741,078 B1 * 5/2004 Overweg .................... 324/318
6,954,070 B1 * 10/2005 Abele ......................... 324/319
2004/0135580 A1 * 7/2004 Abele ......................... 324/318
2006/0033495 A1 * 2/2006 Yamamizu et al. ......... 324/318

* cited by examiner

*Primary Examiner*—Elvin Enad
*Assistant Examiner*—Bernard Rojas

(57) ABSTRACT

An open magnetic structure comprising a conical permanent magnetic structure that generates an MRI imaging field around the body part of a patient in a cavity of the structure. The permanent magnetic sections include a recess over the cavity, with the surface of the structure bounding the recess following a cone angle of the conical permanent magnetic structure. The structure can be configured sufficiently large to accommodate a full patient body.

14 Claims, 8 Drawing Sheets

MRI CONICAL MAGNET IMAGING SYSTEM

The invention is directed to an NMR imaging system using permanent magnets to establish a uniform imaging field.

BACKGROUND OF INVENTION

My U.S. Pat. No. 6,707,363 describes a magnetic structure based upon a conical geometry designed for NMR (sometimes referred to as MRI) head imaging in interventional procedures. The goals include an open structure providing full access to the head region while being imaged to a surgeon, minimize the dimensions and weight of the magnet materials, make an efficient use of the magnetic material with a maximum strength of the NMR imaging field, as well as allow access to the head of the patient from the vertical as well as the horizontal direction.

My improvement patent application, published as US 2004/0135580 A1, teaches several ways to improve the performance involving the use of magnetic straps, and a way to reduce the volume and weight of the permanent magnetic material by recessing a central pole piece to extend inwardly the outer permanent magnet. However, to achieve proper magnetic conditions at the material interfaces so as not to reduce the uniformity of the active magnetic field in the region of interest, it was thought necessary to introduce a non-magnetic region between the inwardly-extending magnetic section and a part of the pole piece and the remainder of the outer permanent magnet.

A further improvement patent application filed Oct. 27, 2003 by me, under application Ser. No. 10/694,419, features a structure wherein the interface between the pole piece and permanent magnetic conical section is configured to form an equipotential surface.

All three of these previous patent applications focused on head imaging, because it did not appear possible at the time those inventions were made with the structures there described to obtain a sufficiently large cavity having a uniform magnetic field in the region of interest to accommodate a larger body part, such as the chest of a patient.

SUMMARY OF INVENTION

The principal object of the invention is a permanent magnetic structure capable of generating a uniform field for NMR imaging over a region of interest encompassing a body part of a patient with a permanent magnetic structure that generates the uniform field and that is open at least at one side allowing access to the body part of the patient by a physician for surgical or other medical purposes.

A further object of the invention is a permanent magnetic structure for NMR imaging of a patient's body part which minimizes the dimensions and weight of the magnet, makes an efficient use of the magnetic material with a maximum strength of the NMR imaging field, and allows access to the body part of the patient from the vertical as well as the horizontal direction.

These objects are achieved in accordance with one aspect of the invention by a structure still based on a conical geometry of the permanent magnet contained between coaxial cones wherein the permanent magnet comprises a recessed section, the inner boundary wall of which defines with the center of the structure a critical angle whose value substantially equals the cone angle of the inner cone with the same center point; that cone being the inner cone of the dual hypothetical cones that form the basis of the conical permanent magnetic design.

In a preferred embodiment, the magnetic structure of the invention comprises a first central structure generating a substantially uniform magnetic field in a region of interest in a gap encompassing the patient's body part, coaxially aligned with an outer structure generating a magnetic field that tends to extend the uniform field into an outer region which assists in maintaining the substantially uniform magnetic field in the region of interest.

In a further preferred embodiment, the inner cone is hollow and a portion of the region inside the inner cone comprises a high-permeability ferromagnetic material serving as a pole piece. Laterally adjacent the high-permeability ferromagnetic material is a permanent magnetic conical section whose cone angle substantially equals the angle of the outer cone of the dual hypothetical cones that form the basis of the conical permanent magnetic design. For best results, it is preferred that certain conditions relating the dimensions of the structure to a design factor K are satisfied.

In still a further preferred embodiment, the magnetic structure comprises opposed, spaced circular-symmetric structures with the region of interest falling within a cavity or gap between the circular-symmetric structures. The main permanent magnetic components of the structure of the preferred embodiment are all magnetized uniformly in the same direction, preferably parallel to the axis of the circular-symmetric structures, and the magnetic field in the region of interest is also oriented in the same direction.

If the various features set forth above are achieved, it is surprisingly found that, compared to the head imager of the previous patent applications, it becomes possible to significantly increase the field strength in the region of interest with a smaller volume and lower weight magnetic structure. Moreover, with larger cavity dimensions, it becomes possible to do whole body imaging with a substantially uniform field intensity.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the present invention, like reference numerals or letters signifying the same or similar components.

DETAILED DESCRIPTION OF PREFERRED EMBODIMENTS

Figure 1:
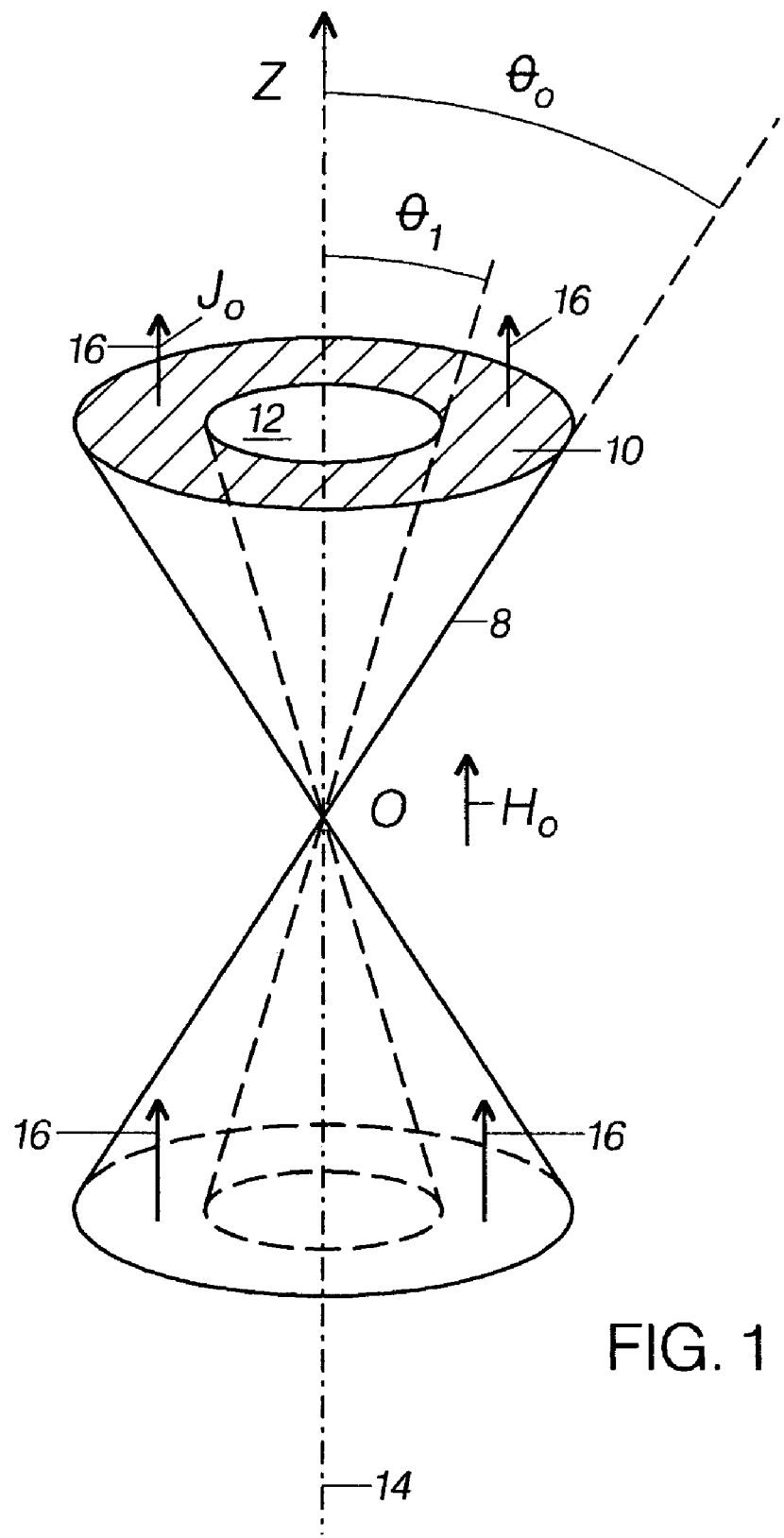
FIG. 1 is a schematic perspective view of a hypothetical conical magnetic structure to explain several of the principles on which the invention is based.

For a better understanding of the present invention, the reader is urged to read the many technical papers which I alone or with others published and which describe various configurations of NMR imaging systems as well as various schemes for compensating for magnetic field disturbances in composite structures that have been characterized as yoked, yokeless, or hybrid magnets. Particular attention is directed to issued U.S. Pat. Nos. 5,495,222; 5,790,006, and 6,265,959 which describe some of the problems of fabricating open magnetic structures with NMR imaging uniform fields and some solutions to those problems, the contents of which patents and publications are herein incorporated by reference. The reader's attention is also directed to U.S. Pat. No. 6,707,363, Patent Application Publication US 2004/0135580 A1, and application Ser. No. 10/694,419 for further information about conical magnetic structures and compensation means for such structures, the contents of which patent, publication, and application are herein also incorporated by reference.

It will also help to present some definitions of terms used herein to avoid ambiguity. These definitions include the following.

A "high permeability" member, as used herein, shall mean a soft ferromagnetic body having a permeability, μ, generally exceeding 10 and preferably as high as possible. For simplicity, it is sometimes referred to in the literature as a (μ=∞) material, i.e., an ideal soft ferromagnetic body. For virtually all practical purposes, the performance of infinite permeability, unsaturated ferromagnetic material is the equivalent of soft iron.

A "yoked magnetic system", as used herein, is a permanent magnetic structure surrounded by a body of high permeability material serving as a yoke to carry the return flux of the induction B from one pole of the magnetic structure to the other pole. To avoid saturation, the yoke should have a large enough cross sectional area to convey the flux without saturating. The cross section typically varies to satisfy local flux-carrying requirements.

A "substantially uniform magnetic field", as used herein, shall mean a magnetic field that over a region of interest has an intensity that varies by about 10–100 ppm or less or can be "tuned" to that degree of uniformity. It will be evident to those skilled in this art that the magnetic structures described herein may not by themselves produce the desired field uniformity and may leave field distortions that detract from the desired value, but these field distortions are sufficiently small that they can be commonly compensated by a known process called "tuning", using, for example, shims to adjust the positions or values of the magnetic members, and/or filters for field non-uniformities that will produce that degree of uniformity that is desired for adequate NMR imaging.

A "magnetic dipole", as used herein, is a permanent magnetic element with a north pole on one end or side and a south pole at its opposite end or side. It can have various shapes. It can, for example, be a small chunk or block or plate typically mounted on a surface bounding the region of interest. For the conical geometry, the preferred magnetic dipole shape is a ring element surrounding and mounted on the conical surface of the permanent magnetic conical element of the structure.

A "magnetic strap", if used herein, is a thin high permeability layer, only thick enough to prevent saturation, that forces the facing contacted surfaces of adjacent magnetic segments to follow equipotential lines or surfaces. Magnetic straps are described in more detail, for example, in U.S. Pat. No. 5,798,680, the contents of which are herein incorporated by reference.

The term "substantially" appears from time to time in the specification and claims. It should be understood in a practical sense to mean small variations in some structure or parameter term or value that does not make significant changes in properties associated with those structures or parameters and are included within the scope of the associated term.

The term "essentially" may appear from time to time in the specification and claims. It should be understood in a practical sense to mean that it defines a structure which functionally can be characterized in a certain way but in which other aspects of the structure may be present that do not strictly conform to the sense used but also do not significantly detract from its prime or essential function. For example, a magnet may be referred to as essentially cylindrical, when in fact it may have non-cylindrical portions. But for design purposes, the magnet can still be characterized as cylindrical as the latter term signifies its main functional attributes.

Magnetic systems of this kind are often designed using a so-called non-dimensional number identified by the symbol K, which can typically vary between 0 and 1. Typically, one starts the design with a chosen value for K depending upon the magnetic materials available and the field intensity desired, and this value of K remains unchanged. However, in accordance with a feature of one of my other inventions, it turns out that relatively small changes in the value for K can have a significant effect on field uniformity, as is explained in the referenced Patent Application Publication. That feature can also be incorporated in the present invention. It will also be understood that permanent magnetic materials having the highest magnetic properties including remanence are preferred. Nowadays, these are the family of rare earth magnets such as Nd,B,Fe. Variations in the relative proportions of the main ingredients of such magnets, as is well known in the art, typically results in variations of the alloy's main magnetic properties, a fact that may be used to implement the above feature of the Patent Application Publication.

When the application speaks of "configuring" the magnetic structure, this is to be understood in the context of this and the referenced literature and patent publications to mean the design scheme of selecting the geometry, dimensions, materials, and magnetizations of the various members of the structure in the light of the design parameter K chosen and such additional constraints as the desired active field intensity, maintenance of field uniformity, and reduction of stray fields.

Open magnetic structures used to implement NMR imaging are often constructed of blocks of permanent magnetic material assembled to form the configuration of the sides, top, and bottom of the structure desired and defining a cavity on its interior for receiving the patient. This is typically a simpler scheme for fabricating such systems as regularly shaped blocks uniformly magnetized in a single direction are easier to fabricate by the usual powder metallurgy and grinding steps. Thus, where the specification or claims call for, for example, a conical or cylindrically-shaped magnetic structure, this should be understood to include a single member with that configuration, or several members held together by magnetic forces forming a composite member with that configuration, since, magnetically speaking, the performance is substantially the same. Moreover, though the magnetic shapes used to illustrate the invention are typically shown with smooth surfaces, in many cases the structure configuration could be implemented with several joined magnetic members which together produce a functional equivalent. For example, the round surface of a conical or cylindrical configuration can sometimes be more easily obtained with a composite structure made up of thin round slabs of permanent magnetic material which form a slightly stepped outer surface. The composite structure, overall, would still be classified as conical or cylindrical, as the case may be, and the resultant orientation of their magnetic fields can still be represented by a single arrow. For convenience, it may also be simpler to define the system using an arbitrary rectangular or spherical coordinate system, in which, as shown in the literature referenced, linear dimensions of the rectangular system coordinate system are measured along the x, y or z dimension, and the corresponding dimensions of the spherical coordinate system are measured along radii and by angles from arbitrary lines or planes, often some central point or origin. Also, for convenience of explanation, in the preferred embodiment which is analyzed in the spherical coordinate system, the direction of the uniform field is chosen parallel to the Z axis which happens to be the cone axis also, and the patient's orientation is chosen such that his or her longitudinal axis is perpendicular to the Z axis, so that, when the patient is within the magnetic structure cavity for body imaging in a normal position flat on his or her back, his or her body stretches in a direction perpendicular to the Z direction, and thus perpendicular to the direction of the uniform field at the plane of the body. The patient would normally lie on a non-magnetic table within the system, but for convenience the table is not shown in the drawings as it has no effect on the magnetic properties. The spherical coordinate system is indicated in the drawings. The description of the invention focuses on the magnetic structure in the vicinity of the body part of the patient to be imaged.

It will also be understood that, in practical situations, normal manufacturing tolerances both in dimensions as well as in magnetic properties of the magnetic blocks introduce minor field distortions and fluctuations which are commonly compensated by a known process called "tuning", for example, using shims to adjust the positions or values of the magnetic members, and filters for field non-uniformities. For example, the referenced Patent Application Publication shows and describes the use of filter structures and ring structures to compensate for field perturbations. These compensations systems also can be used with the structures of the present invention in substantially the same way. Also, in the drawings, arrows are present labeled with a J or H, where J is the standard symbol for remanence, and H the standard symbol for the magnitude of the uniform field. $\mu$ is also the standard symbol for magnetic permeability.

The concepts underlying the development of the invention involve one or more of the following recognitions.

1. A substantially uniform magnetic field capable of implementing NMR imaging can be generated in a cavity by a permanent magnetic structure comprising a conical section defined by an inner cone angle and a coaxial outer cone angle and positioned adjacent the cavity for receiving the patient, the cone angles being selected according to the teachings in this application and the referenced patent, published patent application, and pending patent application.

2. The shape of the structure provides a center cavity connected to an adjacent larger cavity, in which the center cavity can be configured to accommodate a body part of an average patient, and the adjacent larger cavity provides easy access by medical personnel to the body part.

3. The conical section of permanent magnetic material surrounds an inset high permeability magnetic material serving as a pole piece and bounding the cavity.

4. The strength of the uniform field in the cavity can be augmented by extending the conical section outwardly both radially and axially to increase the amount of permanent magnetic material in the structure. The whole permanent magnetic structure can have its remanence oriented in the same direction, preferably parallel to a central axis of symmetry of the structure.

5. An outer permanent magnetic section is recessed over the pole piece, and importantly, the angle formed by its side wall defining the recess is substantially equal to the inner cone angle of the hypothetical dual cones that form the basis for the design.

6. Finally, certain dimensions of the structure preferably are related to the design factor K for optimum performance.

In implementing the principles described above, a number of different configurations of magnetized material and soft ferromagnetic materials may be used. Preferred configurations will be described in detail below, but it will be understood that the invention is not limited to those particular configurations and dimensions where indicated and other different combinations of magnetic materials and of other dimensions can be employed following the principles described below to achieve the benefits of the invention, as will be understood by those skilled in this art.

The invention can be better understood in the context of the simple conical structure illustrated in FIG. 1 comprising two coaxial conical sections 10, 12 having a common cone axis 14 also designated as the Z axis. The conical structure at the top has an apex at the center labeled 0 which is also the apex of the symmetrical inverted conical structure at the bottom. The outer cone 10 is shown cross hatched for clarity. Its cone angle is $\theta_O$ and is contained between half-angle $\theta_O$ and half-angle $\theta_1$, which is the cone angle of the inner cone 12. The outer cone 10 is shown magnetized uniformly with the remanence 16 oriented vertically as shown parallel to the Z axis. The inner cone 12 is shown without hatching for clarity and is assumed to be ferromagnetic with a high permeability. Outside of the outer cone's outer conical surface 8 is a non-magnetic medium. As explained in my referenced patent, published patent application, and pending patent application, there will be formed adjacent the cone 10 in the external medium a uniform magnetic field of intensity $H_0$ that is also oriented parallel to the Z-axis. The uniform magnetic field of intensity $H_0$ has a magnitude of $$\mu_0 H_0 = K J_0 \quad (1)$$

where: $\mu_0$ is the magnetic permeability of a vacuum, and $$K = (1 - u_0^2)\left[1 - \frac{u_0}{u_1} + \frac{u_0}{2}\ln\frac{(1+u_1)(1-u_0)}{(1-u_1)(1+u_0)}\right] \quad (2)$$

and where:

$$u_0 = \cos\theta_0, \quad u_1 = \cos\theta_1 \quad (3)$$

In the conical geometry, it will be seen that the magnitude of H depends on the cone angles, and in certain cases can exceed the remanence of the permanent magnetic materials.

Inside the magnetized material, $J_0$ generates a magnetostatic potential $\Phi$ of $$\Phi(\rho, \theta) = \frac{J_0}{\mu_0}(1 - u_0^2)u_0\rho\left[1 - \frac{u}{u_1} + \frac{u}{2}\ln\frac{(1+u_1)(1-u_1)}{(1-u_1)(1+u)}\right] \quad (4)$$

where $\rho$ and $\theta$ are the polar coordinates and $$u = \cos\theta \quad (5)$$

Figure 2:
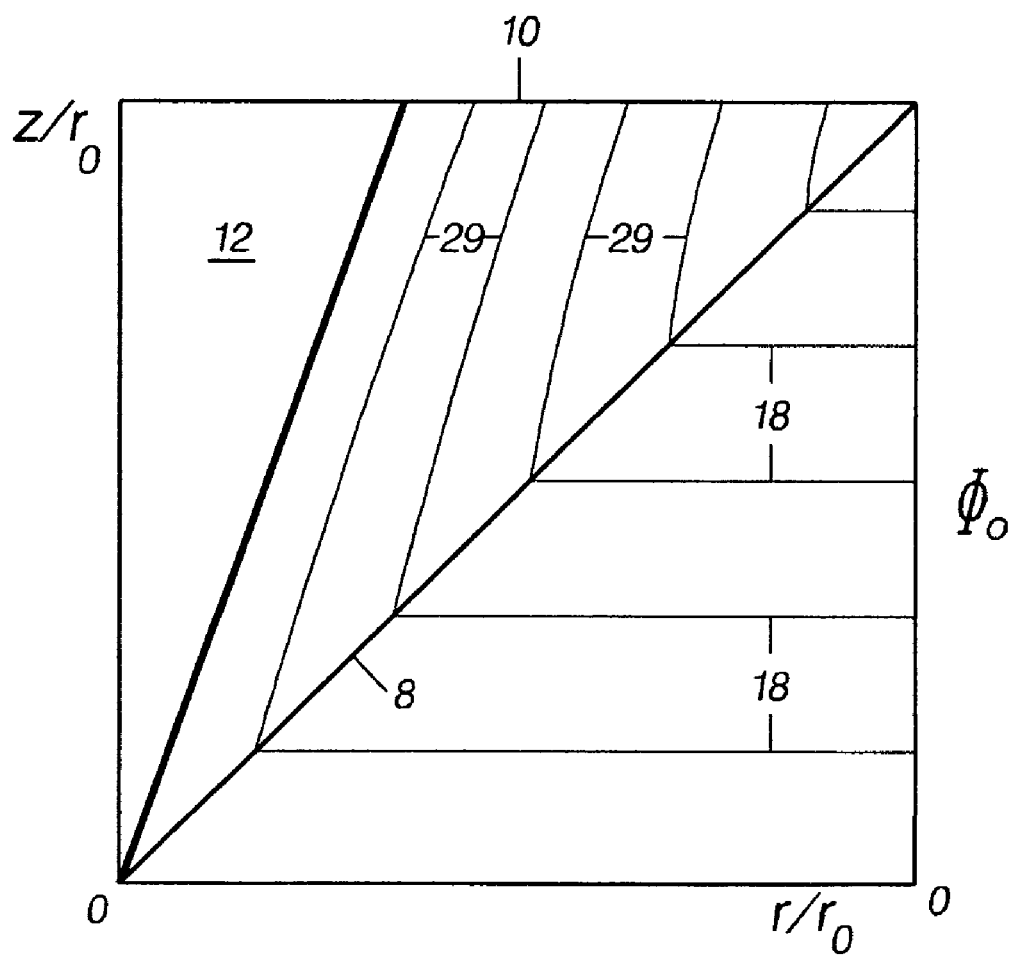
FIG. 2 is a schematic of the basic conical structure with exemplary equipotential lines in the regions outside and inside the structure.

An example of the equipotential lines given by Eq. (4) for the region adjacent the right side 8 of the upper cone magnet 10 is indicated at 18 in FIG. 2, and the equipotential lines inside the magnet 10 is indicated at 29.

Figure 3:
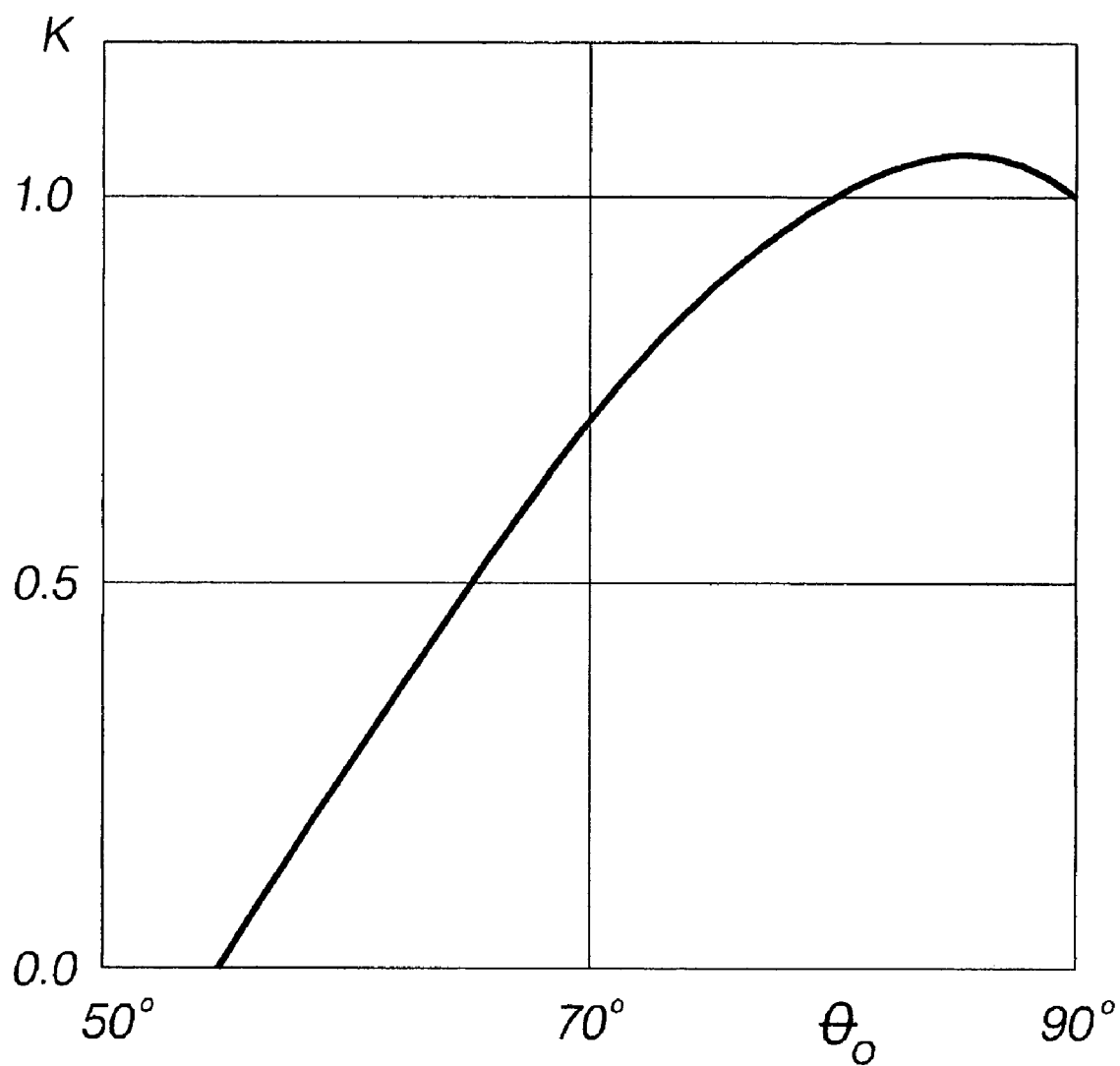
FIG. 3 is a graph showing how K varies as a function of the cone angle of the outer cone for a special case of the conical magnetic structure of FIG. 1.

In the limit $\theta_0 = \pi/2$, Eq. (2) shows that the inductance generated in the external medium becomes equal to the remanence of the material. For a particular condition of of $\theta_1$, $\theta_0$, such that:

$$u_0(1 - u_0^2) = u_1(1 - u_1^2) \quad (6)$$

the flux of the induction across the boundary $\theta = \theta_1$ cancels, and as shown in the graph of FIG. 3, for the special case when Eq. (6) is satisfied, the value of K attains a maximum $$K = 1.06 \text{ at } \theta_0 = 85.56° \quad (7)$$

This characteristic property of the schematic of FIG. 1 indicates that the conical configuration can be an ideal basis for high field permanent magnet design.

Figure 4:
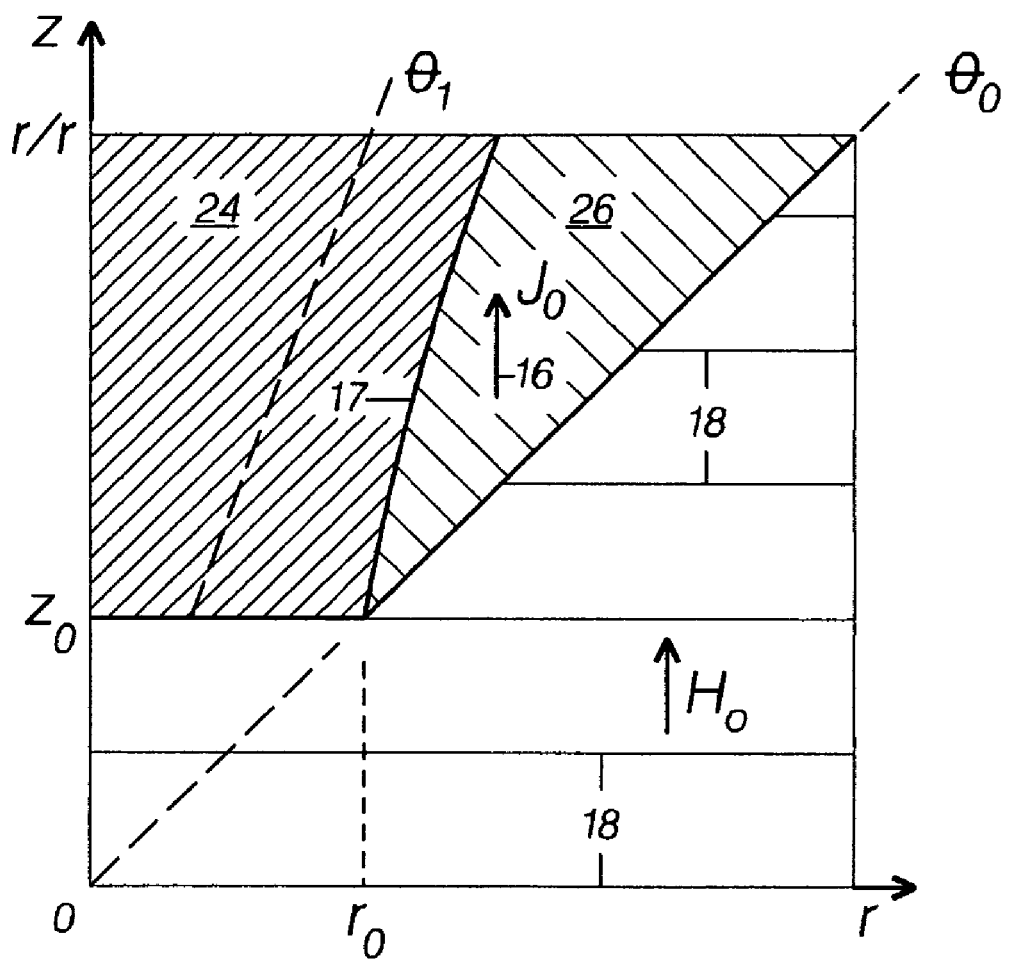
FIG. 4 is another schematic of the basic conical structure with exemplary equipotential lines in the regions outside and inside the structure to further illustrate principles of the invention.

The schematic of FIG. 1 can be transformed into the configuration of FIG. 4 where a gap of dimension $Z_0$ is created at the center of the magnet in order to use the field $H_0$ for practical applications. $2\Phi_0$ is the potential difference across the gap. The field uniformity within the gap is not perturbed if the equipotential surfaces of potential $\pm\Phi_0$ and the surfaces $Z = \pm Z_0$ are transformed into the surface of a medium 24 of infinite magnetic permeability as indicated in FIG. 4, which shows the equipotential lines 18 in the non-magnetic medium and in the gap as well. The section 26 in FIG. 4 is the conical magnet. The slightly curved interface 17 between the conical section 26 and the inset ferromagnetic member 24 preferably has the curvature of the line $C_1$–$C_{10}$ as explained in my copending application, Ser. No. 10/694,419, for best results.

Figure 5:
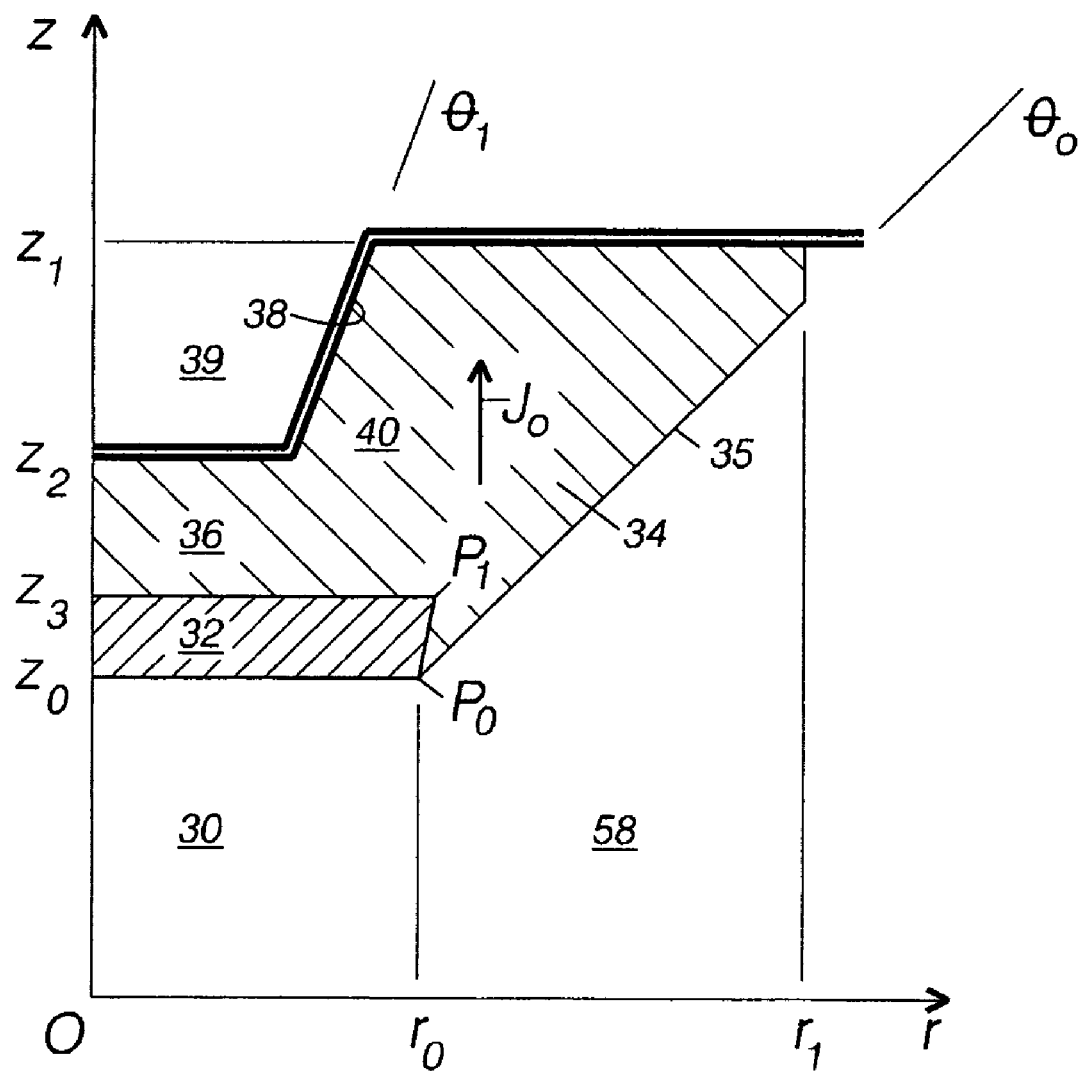
FIG. 5 is a cross-sectional view of part of one embodiment of a conical magnetic structure in accordance with the invention. In this figure and in several of the other figures, only one quarter of the actual structure is shown, as the remaining three quarters are essentially mirror images. In particular, a mirror image of the shown quarter is present on the opposite side of the vertical axis which if present would illustrate the top half of the full structure, and, similarly, a mirror image of that top half is present on the opposite side of the horizontal axis which if present would illustrate both the top and bottom halves and thus the full structure in accordance with the invention. One embodiment of the full structure according to the invention is illustrated in FIG. 8. It will be apparent from the figures which ones represent only part of the full structure.
Figure 8:
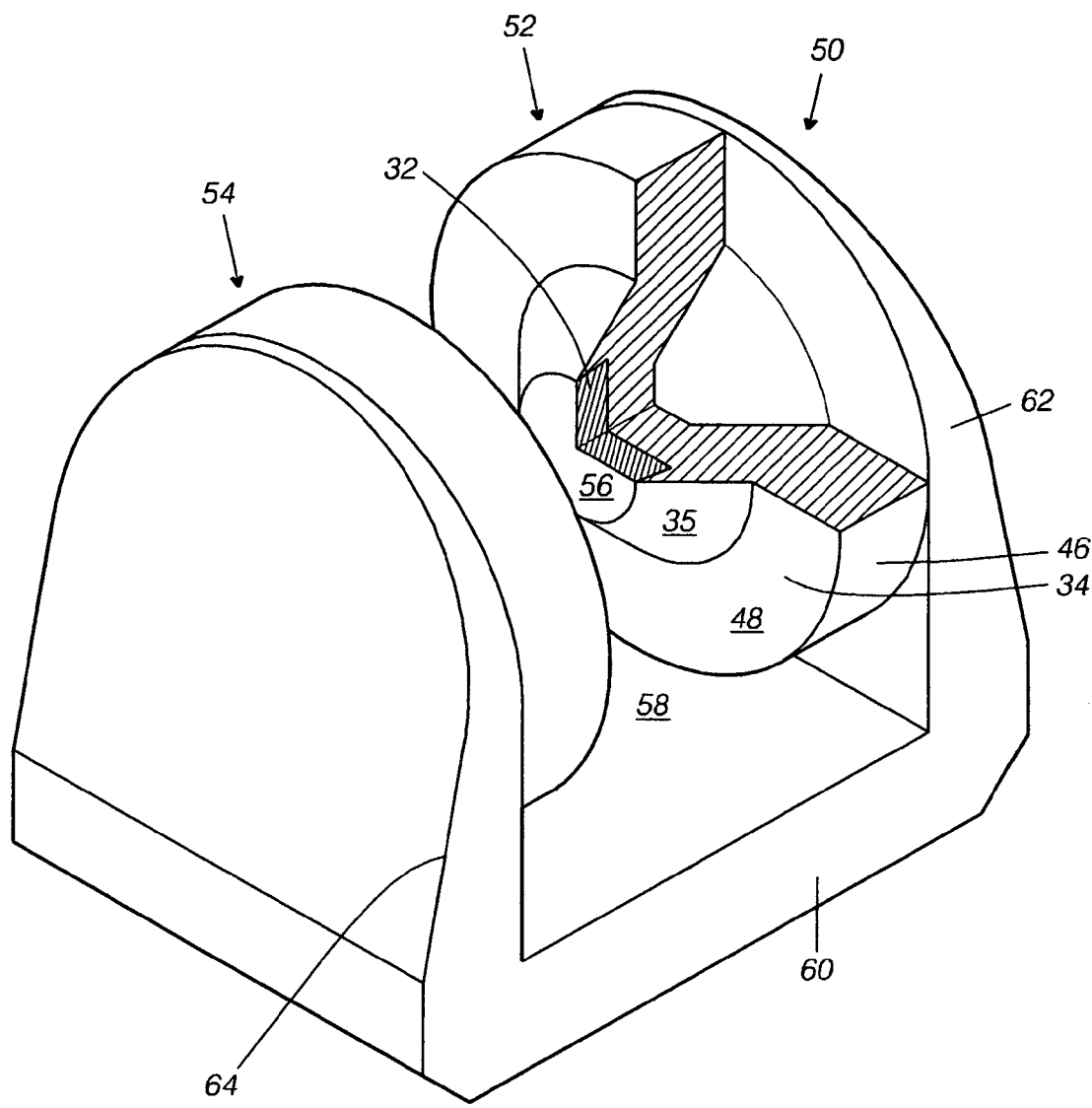
FIG. 8 is a perspective view of the full magnetic structure of the embodiment of FIG. 7 of which only one-quarter was previously illustrated and to which an outer yoke has been added.

A practical implementation of the configuration of FIG. 4 is the design of a magnet as shown in FIG. 5, where the heavy double lines represent the interface of the material with a yoke of the magnet (not shown here but in FIG. 8). For the FIG. 5 design, the magnet, which can be one-piece, can be divided into an outer section 34 whose boundary 35 follows along the angle $\theta_0$, an inner section 36 whose angled boundary 38 at a recess 39 follows along the angle $\theta_1$, and an intermediate section 40 interconnecting the outer 34 and inner 36 sections. No field singularity is generated in the field at point $P_0$ of the ferromagnetic block in FIG. 5 which would perturb the field uniformity within the gap between the pole pieces, and which point determines the basic geometry of the pole piece 24 of the magnetic structure.

In the case of a magnet design for a medical MRI application, the imaging region (region of interest) is intended to extend essentially over the entire region of the gap 30 between the pole pieces 32. Recall that only a ¼ section is shown here. The actual gap height between the top and bottom halves of the symmetrical structure is 2 $Z_0$. As a consequence, in FIG. 5, the conical geometry of the magnetized material 34 can be truncated at a radial distance $r_1$ and an axial coordinate $Z_1$ which were selected to be large enough compared to the dimensions of the gap such as to minimize its effect on the full uniformity within the imaging region.

One observes in FIG. 5, that no attempt is made to eliminate the field singularity generated at point $P_1$, which is sufficiently removed from the region of the gap 30 between the pole pieces 32, and any resulting perturbation of the field uniformity can be compensated with the usual tuning of the magnet, i.e., standard magnetic shimming techniques. The slightly curved shape of the line $P_0$–$P_1$ can have the curvature referred to above, or can be straight with only a small effect on the field uniformity.

To be consistent with the value of K given by Eq. (2), with preferred selected values of $\theta_0$, $\theta_1$, the thickness of the dimension $Z_2$–$Z_3$ of the recessed inner section 36 of magnetized material that interfaces with the pole piece 32 should satisfy the condition $$\frac{z_2 - z_3}{z_0} = \frac{K}{1 - K} \quad (8)$$

and by taking advantage of the distance from the gap, the remanence can be assumed to be uniform throughout the magnetized material 34, 36, 40 and oriented along the axis Z.

As an example, assume the angles $$\theta_0 = 50°, \theta_1 = 20° \quad (9)$$

which results in the value of K $$K = 0.552 \quad (10)$$

in the limit of infinite dimensions of the conical structure.

In a medical implementation for MRI imaging of the head, the gap between the pole pieces may be $$2Z_0 = 30 \text{ cm.} \quad (1)$$

which is sufficient to accommodate the gradient and RF coil that typically surrounds the head of the patient.

Figure 6:
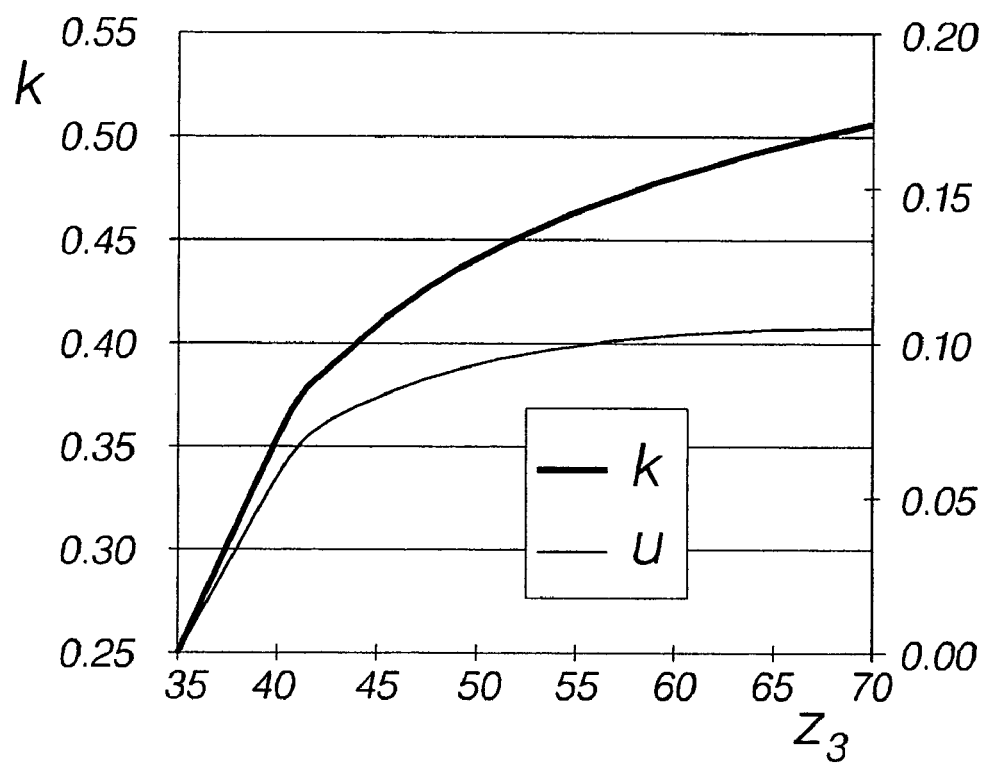
FIG. 6 is a graph of the value K and field uniformity U as a function of one of the dimensions of the structure of FIG. 5.

As a further example, assume that the structure of FIG. 5 is truncated at $r_1 = Z_1 = 45$ cm, and a thickness of the pole piece 32 of $Z_3 - Z_0 = 4$ cm is chosen. The equivalent value of K that gives the field uniformity of $H_0$ at the center of the gap and the field uniformity U within a sphere of 24 cm diameter are plotted in FIG. 6 as a function of the depth $Z_3$ of the yoke recess 39 at the section 36 ($Z_3$ is measured from the origin). A uniformity better than 4% can be achieved for a value of K=0.45. With a magnetic material that has a remanence of $J_o=1.39$ Tesla, the structure of FIG. 5 generates a field within the gap of $$\mu_0 H_0 = 0.6 \text{ Tesla} \quad (12)$$

with a total amount of magnetic material of only $$W = 1.75 \text{ Tons} \quad (13)$$

The field uniformity can be improved to the values required for imaging (10–100 ppm) by means of the shimming and other compensation techniques described in the referenced patents, papers, and published patent applications, as for example based upon cancellation of spatial harmonics of the field distortion.

Figure 7:
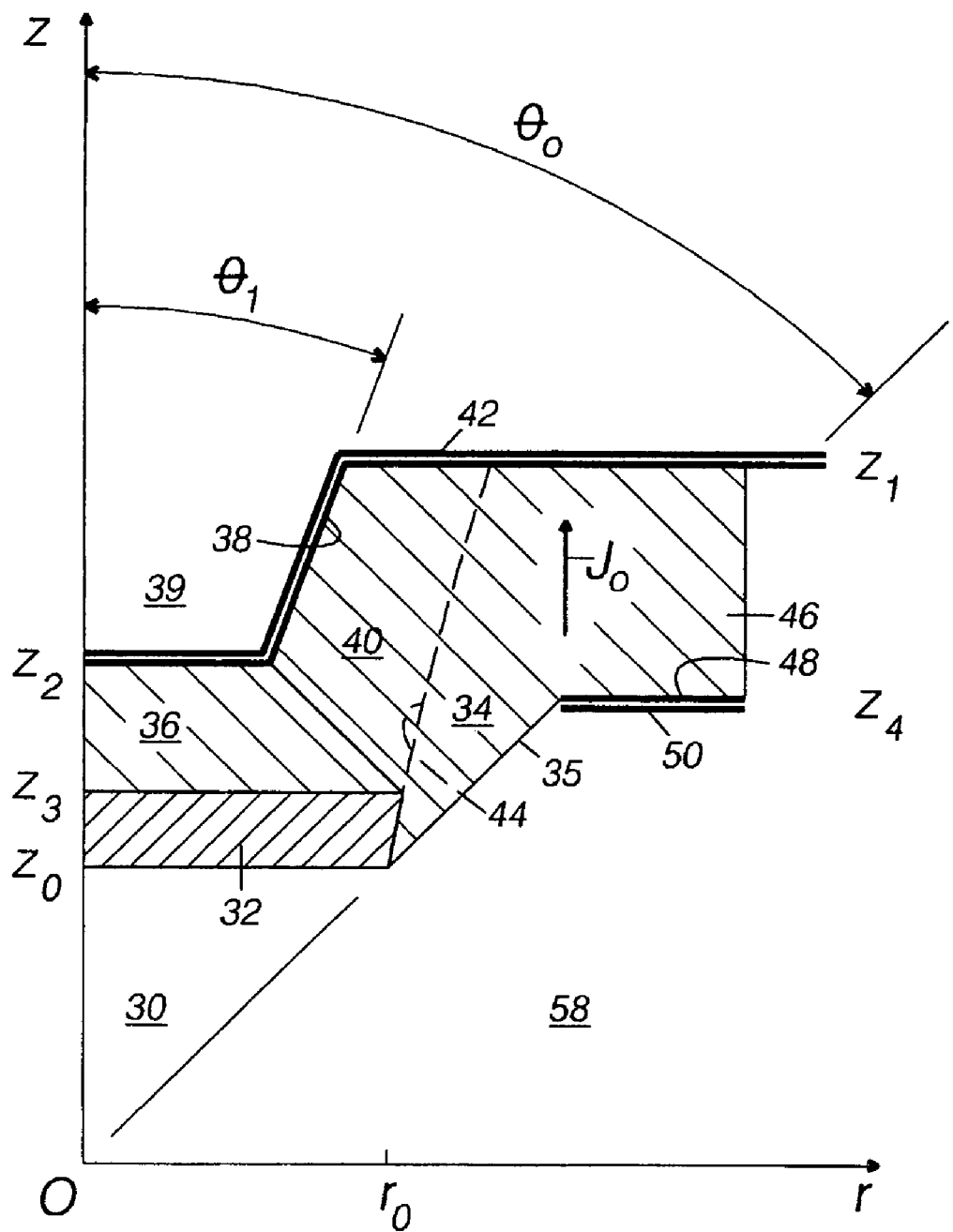
FIG. 7 is a cross-sectional view of part of another preferred embodiment of a magnetic structure in accordance with the invention.

FIG. 7 shows a further modification, with the yoke indicated at 42. The dashed line 44, which is an extension of the outer boundary of the pole piece 32 corresponds to the line $C_1-C_{10}$ of the copending application. In this modification, the outer generally cylindrical portion 46 of the conical section 34 has been truncated and the resulting boundary 48 provided with a high permeability member 50 to maintain an equipotential surface parallel to the horizontal axis.

One of the major differences with the designs of my earlier applications is that the boundary 38 of the intermediate magnetized section 40 extends along the line corresponding to the angle $\theta_1$. This significantly contributes to the field uniformity of the gap avoiding the necessity to include some of the more complex features mentioned in my earlier applications, such as internal magnetic straps or cavities to maintain the proper conditions for ensuring optimum field uniformity in the imaging region or region of interest.

All of the permanent magnetic sections are symmetric about the common axis Z and are all oriented with their remanence $J_0$ also parallel to the Z-axis. The several permanent magnetic sections can be parts of a single magnetic structure or assembled pieces with the shape and magnetic orientation illustrated by the arrow $J_0$. The pole pieces are represented by inset soft ferromagnetic generally cylindrical sections 32 that bound as before the cavity.

Some additional typical dimensions in cm for another design of the upper right quadrant of FIG. 5, which are not intended to be limiting, are as follows: $\theta_0$ is about 45° and $\theta_0$ is about 20° and correspond to the half-angle $\theta_0$ and half-angle $\theta_1$ of the hypothetical cone of FIG. 1. The space underneath the structure and thus between it and the corresponding not-shown structure beneath forms the cavity 30 for receiving the patient body part to be imaged. As will be noted, the cavity includes a center region and a larger contiguous surrounding adjacent region. The radius $r_1$ is about 68 cm, the radius $r_0$ is about 25 cm, the thickness of the pole piece is about 8 cm, the thickness of the recessed magnetic section 36 is about 18.5 cm, and the overall height $Z_1$ is about 75 cm.

It will also be noted from FIG. 7 that the height (above the horizontal axis) of the top surface of the pole piece 32 ($Z_3$) is below the height of the truncated surface 48 of the outer conically-shaped permanent magnetic section 46 ($Z_4$). What this illustrates is the shallowness of the pole piece 32 compared to that of the pole pieces described in my earlier applications. Moreover, by configuring the surface 38 bounding the recess 39 to follow very closely the inner cone angle $\theta_1$, cavities and straps required in previous embodiments can be omitted, allowing the permanent magnetic sections to be integrated into a one-piece structure. It will also be apparent to those skilled in the art that the distance between the two pole pieces 32 can increase as the radial coordinate r increases in order to maximize the access to the gap between the pole pieces from the outside, and the geometry of the magnetized blocks and their interface with the pole pieces is designed to generate a uniform field of intensity $H_0$ within the entire gap between the pole pieces that extends beyond the outside dimension $r_0$ in order to have the entire volume of the gap as the useful working region of the magnet.

FIG. 8 is a perspective view of the structure of FIG. 7 providing a view of a complete form of a preferred embodiment according to the invention indicated by 50. Looking at the perspective, imagine that the structure illustrated in FIG. 7 is rotated about the vertical and horizontal axes originating at the origin 0, are is thus expanded to include both upper right (shown in FIG. 7) and left quadrants, to form a circular-symmetrical magnetic structure 52, spaced opposite to an identical structure 54 corresponding to the lower right and left quadrants. The cavity space between is referenced 30 which is bounded by the bottom surfaces 56 of the inset ferromagnetic pole pieces 32 and constitutes the imaging body cavity bordered on all sides by the larger outer 58 cavity defined by the permanent magnetic components 34, 46. To the opposed symmetrical structures made up of the rotated quadrant illustrated in FIG. 7 has been added a conventional soft ferromagnetic U-shaped yoke with its bight 60 at the bottom and the two arms 62, 64 embracing the corresponding backs of the outer 46, inner 36, and intermediate 40 magnetized sections. The Z-axis in FIG. 8 is the axis of symmetry of the structure. In this and several of the other embodiments, the magnetized conical sections from opposite sides taper toward the origin, represented in FIG. 7 by O, so that the narrow end of the cone, corresponding to the point $P_0$ in FIG. 5, is adjacent to the body cavity 30 and the wider cone end represented by higher values of r and Z are further remote from the cavity. The FIG. 8 embodiment shows one quadrant corresponding to FIG. 7 cut out and removed to show the inner construction. As will be observed, with the structure 50 lying on its base represented by the yoke bight 60, due to the symmetry, the patient can be introduced into the cavity from both sides as well as from the top, as the outer cavity 58 surrounds the smaller inner cavity 30. The patient is positioned for MRI imaging with its body part to be imaged inside the cavity 30.

The drawings are generally to scale, and the relative dimensioning is only exemplary, and indicate representative values for one preferred magnet design.

In the implementation illustrated in FIG. 8, the magnetic structure is open from all sides except for the yoke base side to allow access to the surgical area. This opening usually introduces a distortion of the uniform field in the imaging region that must be partially corrected to bring the field variation within acceptable limits, typically within 10–100 ppm. This correction is part of the tuning or shimming of the magnet that compensates the distortion induced not only by the opening but also by the magnetization and fabrication tolerances.

One way to accomplish the tuning of the magnet is by means of a filter structure assembled on the outer magnetic structure surfaces 35 of the conical section as described in detail in one of my publications entitled "Linear Theory of Pole Piece Design in Permanent Magnets", published in the Proceedings of the Thirteenth International Workshop on Rare Earth Magnets and their Applications, Sep. 11–14, 1994, Birmingham, United Kingdom, whose contents are incorporated by reference in this application. This paper explains that the design of a suitable filter structure is the result of a linear theory of pole pieces developed by the author, in which the imaging region is assumed to be confined in a cylinder whose axis contains the imaging center and is perpendicular to the pole pieces. The cylinder is closed by the surfaces of the two pole pieces that act like reference surfaces of the magnetostatic potential. This potential generated by the magnet inside the cylinder is expanded in cylindrical harmonics as shown by equation 22 in the referenced paper in which the symbols have the meanings indicated in the paper and therefore do not need repeating here. In that equation, the first term on the right hand side is the uniform field, and the other terms are the harmonics of the field distortion corrected by the filter structure as described in that paper. These harmonics are eliminated if the sections of the filter are polarized with a dipole moment that satisfies equation 24 of the paper. As will be observed from the paper, the series of the field distortion converges rapidly and, as a consequence, only the lower order harmonics have to be compensated. The system of FIG. 8 can be compensated by concentrating on the surfaces of the conical structure bounding the cavities a suitable distribution of correcting dipole moments in magnets. Specific examples of filter design suitable for this application can be found in the paper and in my issued U.S. Pat. Nos. 5,475,355 and 5,495,222, whose contents are incorporated by reference in this application. One form of active filter structures are thin sandwiches of outer soft ferromagnetic plates bounding the cavity, magnetically isolated from the supporting magnetic structure, with a permanent magnetic insert or inserts between the plates. They can be located in accordance with the principles enunciated in the paper along the cavity-bounding interior surfaces to reduce or minimize field distortion. The filter structures typically tend to be positioned in the vicinity of the region of interest, which typically embraces the body cavity.

Those skilled in the art will appreciate that the invention is not necessarily limited to structures with the dimensions indicated in the drawings, which are only to illustrate the size of particular embodiments. The preferred geometries illustrated can be replaced by other geometries following the principles described herein. In particular, the half-angle $\theta_0$ and half-angle $\theta_1$ are not limited to the several values given in the preferred embodiments. Those values are preferred because they represent a good practical compromise among factors such as the overall size of the unit, the volume of magnetic material required, the magnetic field intensity, the patient's accommodation, and most important the field uniformity. Minor changes, for example, increasing $\theta_0$ (for example, $\theta_1 = 20°$, $\theta_0 = 50°$) increases the structure's size, requires more magnetic material, and may undesirably reduce the patient's cavity, though it will also allow a higher field intensity with the increased magnetic material. Keeping $\theta_0$ at 50°, but increasing $\theta_1$ to 30°, for example, likewise may also require more magnetic material but will result in a smaller field intensity. Reducing both angles will likely produce too narrow a practical structure with inadequate patient space. These other geometries are also considered within the scope of the invention. It will also be understood that the patient may be rotated about the y axis within the magnetic structure in order to allow the surgeon to access different sides of the brain.

A number of important advantages flow from the configurations of the invention, which include: an overall smaller structure size requiring less magnetic material while maintaining a high field intensity, accomplished with a structure that is considerably simpler than alternative structures.

Those skilled in the art will also appreciate that the invention is not limited to the specific shape of the yoke, and other geometries are also considered within the scope of the invention so long as saturation is avoided.

As explained in one of my earlier applications, when a series of computation are conducted of the field intensity in the region of interest and its variation over the region of interest for different values of K, it was unexpectedly discovered that a small adjustment in K, typically a small increase, can result in an improvement of uniformity, and this feature can also be incorporated in the present design.

Another feature of the invention in one of my earlier applications is an improved compensation scheme for the conical magnetic structure geometries described herein that comprises the judicious placement of magnetic dipoles about the structure. Preferably, the magnetic dipoles are in the form of axially-spaced discrete shimming rings or annular elements. The location of the magnetic dipoles, and their magnitude and orientation are determined by following the methodology described in great detail in the earlier application and this feature can also be incorporated in the present design.

The design approach described herein makes the permanent magnetic technology ideal for integrating MRI instrumentation in a medical procedure, and that also provides an open structure for medical intervention. Compared to traditional magnets, the structures of FIGS. 5 and 7 offer maximum accessibility to the imaging region which extends over a major portion of the gap between the pole pieces. The design will result in a powerful compact magnetic structure whose dimensions and weight make it notable for integration in a medical suite with minimum interference with the surgical instrumentation and procedures. The principles described herein allow, as distinguished from my earlier filed head imaging applications, a gap large enough to accommodate body parts larger than the head including full body imaging.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A magnetic structure for generating a substantially uniform magnetic field capable of implementing MRI imaging of a body part of a patient within a region of interest, comprising:
   a) first (52) and second (54) magnetic structures defining a first cavity (30) having the region of interest and configured to accommodate a body part of a patient and defining adjacent the first cavity a second cavity (58), larger than the first cavity, the first and second magnetic structures being positioned on opposite sides of the first and second cavities and defining a common longitudinal axis (Z) through the centers of the first and second magnetic structures and providing access from the outside for surgical intervention to the body part of the patient when positioned within the first cavity,
   characterized in that:
   b) each of the first and second magnetic structures comprises:
      i) an outer conically-shaped permanent magnetic section (34) having a conical axis and having a narrow end adjacent the first cavity,
      ii) an inner permanent magnetic section (36) having a central axis,
      iii) an intermediate permanent magnetic section (40) integrally connecting the inner and outer permanent magnetic sections, c) the inner permanent magnetic section (36) having a recess (39) at the central axis, d) the intermediate permanent magnetic section (40) having a surface (38) bounding the recess (39), e) the outer surface (35) of the outer conically-shaped permanent magnetic section (34) being aligned with an angle $\theta_0$ constituting the outer cone angle of the outer conically-shaped permanent magnetic section (34), f) the surface (38) bounding the recess (39) being aligned substantially with an angle $\theta_1$ constituting the inner cone angle of the outer conically-shaped permanent magnetic section (34), g) the permanent magnetic sections being configured to produce within the region of interest in the first cavity a substantially uniform magnetic field (H) capable of implementing MRI imaging of the body part when present in the first cavity.

2. A magnetic structure for generating a uniform magnetic field capable of implementing MRI imaging of the body part of a patient within a region of interest as claimed in claim 1, characterized in that:

the outer, inner, and intermediate magnetic sections are configured such that the second cavity surrounds the first cavity.

3. A magnetic structure for generating a uniform magnetic field capable of implementing MRI imaging of the body part of a patient within a region of interest as claimed in claims 2, characterized in that:

both the first and second magnetic structures are circular symmetric about the common longitudinal axis, and the outer, inner, and intermediate magnetic sections are configured to form an annular structure symmetric about the common longitudinal axis.

4. A magnetic structure for generating a uniform magnetic field capable of implementing MRI imaging of the body part of a patient within a region of interest as claimed in claims 3, characterized in that:

each of the first and second magnetic structures further comprises inset at the bottom of the inner and intermediate magnetic sections a high permeability ferromagnetic member (32), each of the high permeability ferromagnetic members have a flat first surface adjacent the first cavity.

5. A magnetic structure for generating a uniform magnetic field capable of implementing MRI imaging of the body part of a patient within a region of interest as claimed in claims 4, characterized in that:

the outer permanent magnetic section has an outer part (46) extending away from the first cavity, the outer part having a surface (48) bordering the second cavity and substantially parallel to the flat first surface of the high permeability ferromagnetic member (32).

6. A magnetic structure for generating a uniform magnetic field capable of implementing MRI imaging of the body part of a patient within a region of interest as claimed in claims 5, characterized in that:

the high permeability ferromagnetic member (32) has a top surface adjacent the inner and intermediate permanent magnetic sections and is shallow in thickness such that its top surface is at a level closer to the first and second cavities than is that of the surface (48) of the outer part (46).

7. A magnetic structure for generating a uniform magnetic field capable of implementing MRI imaging of the body part of a patient within a region of interest as claimed in claims 6, characterized in that:

the cone angles $\theta_1$ and $\theta_0$ have values of about 20° and 45°–50°, respectively.

8. A magnetic structure for generating a uniform magnetic field capable of implementing MRI imaging of the body part of a patient within a region of interest as claimed in claim 7, characterized in that:

the substantially uniform magnetic field is oriented in a direction parallel to the common longitudinal axis, and the remanences (J) of the inner, outer, and intermediate magnetic sections are also oriented in a direction parallel to the common longitudinal axis.

9. A magnetic structure as claimed in claim 8, characterized in that:

further comprising a yoke (60) magnetically connected to the first and second magnetic structures.

10. A magnetic structure for generating a uniform magnetic field capable of implementing MRI imaging of the body part of a patient within a region of interest as claimed in claim 9, characterized in that:

the inner, outer, and intermediate magnetic sections form an integral body free of cavities and straps.

11. A magnetic structure for generating a uniform magnetic field capable of implementing MRI imaging of the body part of a patient within a region of interest as claimed in claim 9, characterized in that:

the yoke has a portion (62, 64) extending into the recess (39) of the inner permanent magnetic section.

12. A magnetic structure for generating a uniform magnetic field capable of implementing MRI imaging of the body part of a patient within a region of interest as claimed in claim 9, characterized in that:

the yoke is U-shaped and has a bight portion (60) and arm portions (62, 64) flanking opposite ends of the first (52) and second (54) magnetic structures.

13. A magnetic structure for generating a uniform magnetic field capable of implementing MRI imaging of the body part of a patient within a region of interest as claimed in claim 9, characterized in that:

the structure has a center located in the center of the first cavity, the magnetic properties and configuration of the permanent magnetic sections are based on a selected design factor K, the surface of the high permeability ferromagnetic member bounding the first cavity is at a first level ($Z_0$) relative to the center, the top surface of the high permeability ferromagnetic member is at a second level ($Z_3$) relative to the center, the surface of the inner permanent magnetic section bordering the recess is at a third level ($Z_2$) relative to the center, the ratio of the third level minus the second level to the first level being related to the design factor K.

14. A magnetic structure for generating a uniform magnetic field capable of implementing MRI imaging of the body part of a patient within a region of interest as claimed in claim 12, characterized in that:

the thickness $[(Z_2)-(Z_3)]$ of the permanent magnetic sections over their respective high permeability ferromagnetic member (32) substantially satisfies the following equation:

$$[(Z_2)-(Z_3)]/(Z_0)=K/[1-K].$$

* * * * *